United States Patent
Lee et al.

(10) Patent No.: US 12,043,770 B2
(45) Date of Patent: Jul. 23, 2024

(54) TEMPORARY BONDING COMPOSITION, TEMPORARY BONDING FILM, COMPOSITE FILM, TEMPORARY BONDING METHOD AND SEMICONDUCTOR WAFER PACKAGE

(71) Applicant: Daxin Materials Corporation, Taichung (TW)

(72) Inventors: Cheng-Wei Lee, Taichung (TW); Pei-Ci Cho, Taichung (TW); Chun-Hung Huang, Taichung (TW); Min-Chi Yang, Taichung (TW); Chi-Yen Lin, Taichung (TW); Yuan-Li Liao, Taichung (TW)

(73) Assignee: Daxin Materials Corporation, Taichung (TW)

( * ) Notice: Subject to any disclaimer, the term of this patent is extended or adjusted under 35 U.S.C. 154(b) by 1215 days.

(21) Appl. No.: 16/729,461

(22) Filed: Dec. 29, 2019

(65) Prior Publication Data

US 2021/0040365 A1 Feb. 11, 2021

(30) Foreign Application Priority Data

Aug. 8, 2019 (TW) .................................. 108128361

(51) Int. Cl.
| | |
|---|---|
| C09J 179/08 | (2006.01) |
| C09J 5/06 | (2006.01) |
| C09J 7/35 | (2018.01) |
| C09J 11/04 | (2006.01) |
| H01L 21/683 | (2006.01) |

(52) U.S. Cl.
CPC ............... *C09J 179/08* (2013.01); *C09J 5/06* (2013.01); *C09J 7/35* (2018.01); *C09J 11/04* (2013.01); *H01L 21/6835* (2013.01); *C09J 2203/326* (2013.01); *C09J 2301/416* (2020.08); *C09J 2301/502* (2020.08); *C09J 2479/08* (2013.01)

(58) Field of Classification Search
CPC ..... C09J 179/08; C09J 5/06; C09J 7/35; C09J 11/04; C09J 2203/326; C09J 2301/416; C09J 2301/502; C09J 2479/08; C09J 2301/408; C09J 2477/00; C09J 7/10; C09J 175/12; C09J 11/06; C09J 179/04; C09J 201/02; C09J 7/30; C09J 11/00; H01L 21/6835; H01L 2221/68327; H01L 2221/68381; H01L 23/293; C08K 3/04; C08K 3/28; C08K 3/36; C08K 2003/2237; C08K 2003/2265; C08K 5/0025; C08K 5/06; C08K 5/09; C08K 5/17; C08K 5/175; C08K 5/29; C08G 73/1042; C08G 73/1046; C08G 73/1082; C08G 73/1039
See application file for complete search history.

(56) References Cited

U.S. PATENT DOCUMENTS

| | | | |
|---|---|---|---|
| 4,404,246 A | 9/1983 | Charbonneau et al. | |
| 8,343,851 B2 | 1/2013 | Kim et al. | |
| 11,097,306 B2 | 8/2021 | Tang et al. | |
| 11,348,801 B2 | 5/2022 | Uzoh et al. | |
| 2005/0154181 A1 | 7/2005 | Dueber et al. | |
| 2018/0081273 A1* | 3/2018 | Tamura | ................... G03F 7/038 |

FOREIGN PATENT DOCUMENTS

| | | |
|---|---|---|
| CN | 1042168 A | 5/1990 |
| CN | 102037043 A | 4/2011 |
| CN | 105086913 A | 11/2015 |
| CN | 104673112 B | 9/2017 |
| CN | 108803240 A | 11/2018 |
| EP | 0361728 A2 | 4/1990 |
| JP | S59-80483 A | 5/1984 |
| JP | H044079 A | 1/1992 |
| JP | H05-43615 A | 2/1993 |
| JP | 2005-325332 A | 11/2005 |
| JP | 2008133423 A | 6/2008 |
| JP | 2008239802 A | 10/2008 |
| JP | 2012116911 A * | 6/2012 |
| JP | 2012116911 A | 6/2012 |
| JP | 2013-176985 A | 9/2013 |
| JP | 2015-214636 A | 12/2015 |
| JP | 2016086158 A | 5/2016 |
| JP | 2017098474 A | 6/2017 |
| JP | 2017122157 A | 7/2017 |
| KR | 20180121228 A | 11/2018 |
| TW | 201544567 A | 12/2015 |
| TW | 201544567 A * | 12/2015 |

(Continued)

OTHER PUBLICATIONS

Mark Huang Shuangwu et al., "Temporary Bonding of Wafer to Carrier for 3D-Wafer Level Packaging", 2008 10th Electronics Packaging Technology Conference, dated on Dec. 9-12, 2008, pp. 405-411, Singapore. (Year: 2008).*
K. Zoschke et al., "Polyimide based Temporary Wafer Bonding Technology for High Temperature Compliant TSV Backside Processing and Thin Device Handling", 2012 IEEE 62nd Electronic Components and Technology Conference, dated on May 29-Jun. 1, 2012, pp. 1054-1061, United States.
Mark Huang Shuangwu et al., "Temporary Bonding of Wafer to Carrier for 3D-Wafer Level Packaging", 2008 10th Electronics Packaging Technology Conference, dated on Dec. 9-12, 2008, pp. 405-411, Singapore.

*Primary Examiner* — Daniel H Lee
(74) *Attorney, Agent, or Firm* — CKC & Partners Co., LLC

(57) ABSTRACT

A temporary bonding composition is provided. The temporary bonding composition includes a polyfunctional crosslinker, a polymer and a solvent. The polyfunctional crosslinker includes a compound containing at least two functional groups selected from the group consisting of blocked isocyanate groups, alkenyl ether groups, and alkoxyhydrocarbyl groups. Each of the blocked isocyanate groups is an isocyanate group blocked by a blocking agent. The polymer has a functional group reacting with the polyfunctional crosslinker.

6 Claims, 9 Drawing Sheets

(56) References Cited

FOREIGN PATENT DOCUMENTS

| | | | |
|---|---|---|---|
| TW | 201546231 | A | 12/2015 |
| TW | 201838959 | A | 11/2018 |
| WO | 2015129682 | A1 | 9/2015 |
| WO | 2015182469 | A1 | 12/2015 |
| WO | 2016021646 | A1 | 2/2016 |

* cited by examiner

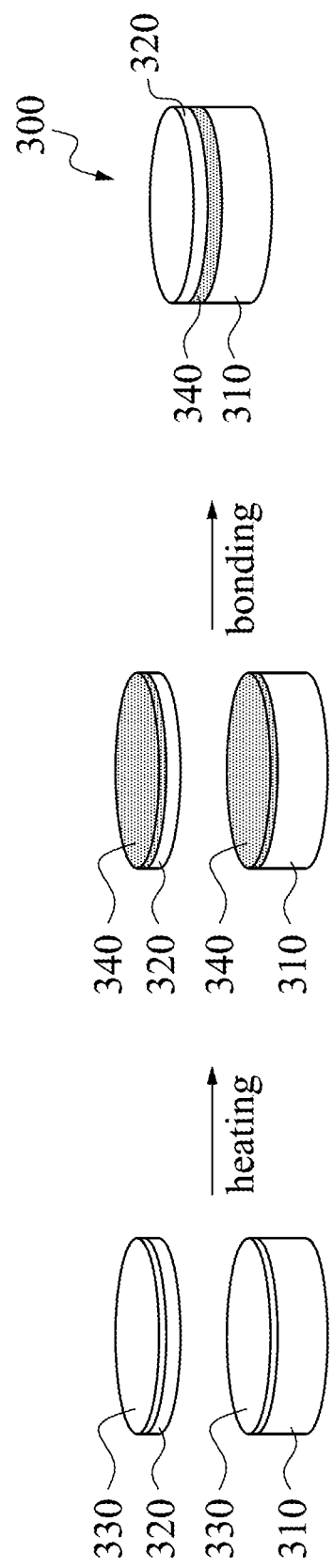

TEMPORARY BONDING COMPOSITION, TEMPORARY BONDING FILM, COMPOSITE FILM, TEMPORARY BONDING METHOD AND SEMICONDUCTOR WAFER PACKAGE

RELATED APPLICATIONS

This application claims priority to Taiwan Application Serial Number 108128361, filed Aug. 8, 2019, which is herein incorporated by reference.

BACKGROUND

Technical Field

The present disclosure relates to a temporary bonding composition, a temporary bonding film, a composite film, a temporary bonding method and a semiconductor wafer package. More particularly, the present disclosure relates to a temporary bonding composition, a temporary bonding film, a composite film with the excellent thermal compression and the solvent resistance, and a temporary bonding method and a semiconductor wafer package using thereof.

Description of Related Art

With the thinning of the semiconductor devices, the temporary bonding/debonding technology becomes one of the most important technologies in the recent years. In general, the workpiece (i.e. wafer) should be bonded with the supported substrate by the temporary bonding adhesive, so as to perform the subsequent process to the workpiece. After the process is completed, the temporary bonding adhesive is removed to separate the workpiece from the supported substrate.

However, in the conventional temporary adhesion technique, the adhesive layer mainly relies on the adhesive property during the pressing process. Therefore, when a thick film is coated, such as by the spin coating, the bar coating, etc., a thick edge phenomenon is caused, so that it is impossible to achieve no overflow under the high deformation, and flatten the thickness difference of the thick side of 30 to 40 μm and take into account the chemical resistance at the same time. Furthermore, when the thick film is pressed, there will be an uncompressed area at the edge due to the deformation and the lack of flexibility of the press carrier.

Therefore, it is necessary to provide an improved temporary bonding composition having the excellent thermal compression and the solvent resistance with appropriate debonding method.

SUMMARY

According to one aspect of the present disclosure, a temporary bonding composition is provided. The temporary bonding composition includes a polyfunctional crosslinker, a polymer and a solvent. The polyfunctional crosslinker includes a compound containing at least two functional groups selected from the group consisting of blocked isocyanate groups, alkenyl ether groups, and alkoxyhydrocarbyl groups. Each of the blocked isocyanate groups is an isocyanate group blocked by a blocking agent. The polymer has a functional group reacting with the polyfunctional crosslinker.

According to another aspect of the present disclosure, a temporary bonding film is provided. The temporary bonding film includes a polyfunctional crosslinker, a polymer and a light absorbing material. The polyfunctional crosslinker includes a compound containing at least two functional groups selected from the group consisting of blocked isocyanate groups, alkenyl ether groups, and alkoxyhydrocarbyl groups. Each of the blocked isocyanate groups is an isocyanate group blocked by a blocking agent. The polymer has a functional group reacting with the polyfunctional crosslinker.

According to further aspect of the present disclosure, a composite film is provided. The composite film includes a detachable supported film and the temporary bonding film according to the aforementioned aspect. The temporary bonding film is disposed on a surface of the detachable supported film.

According to still another aspect of the present disclosure, a temporary bonding method includes the following steps. A combining step is performed, wherein an adhesive layer is formed on a surface of at least one substrate and/or at least one workpiece. A bonding step is performed, wherein the substrate and the workpiece are bonded by the adhesive layer. A heating step is performed, wherein the substrate and the workpiece are heated. A processing step is performed, wherein the workpiece is processed. A debonding step is performed, wherein the adhesive layer is irradiated with a laser so as to separate the workpiece from the substrate. The adhesive layer is formed by the temporary bonding composition according to the aforementioned aspect.

According to yet another aspect of the present disclosure, a semiconductor wafer package is provided. The semiconductor wafer package includes the temporary bonding composition according to the aforementioned aspect.

BRIEF DESCRIPTION OF THE DRAWINGS

The present disclosure can be more fully understood by reading the following detailed description of the embodiment, with reference made to the accompanying drawings as follows:

FIG. 3C is a schematic diagram of further step of the step 110 and the step 120 in FIG. 1.

DETAILED DESCRIPTION

Figure 1:
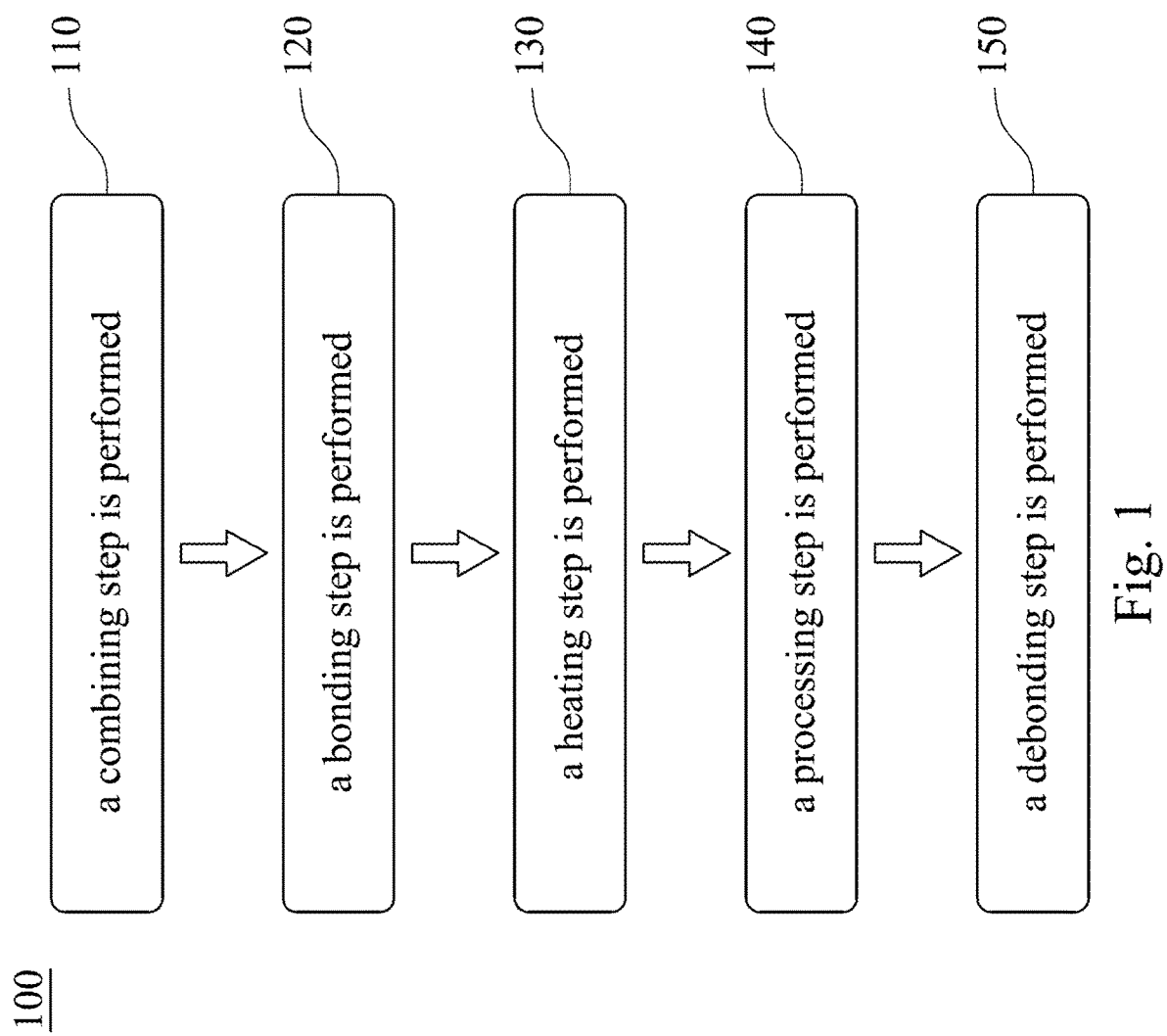
FIG. 1 is a flow chart of a temporary bonding method according to one embodiment of the present disclosure.

The present disclosure will be further exemplified by the following specific embodiments. However, the embodiments can be applied to various inventive concepts and can be embodied in various specific ranges. The specific embodiments are only for the purposes of description, and are not limited to these practical details thereof.

A Temporary Bonding Composition

A temporary bonding composition of the present disclosure includes a polyfunctional crosslinker, a polymer and a solvent. Preferably, the temporary bonding composition of the present disclosure can further include a light absorbing material. The aforementioned components will be described in detail hereafter.

Polyfunctional Crosslinker

In the present embodiments, the polyfunctional crosslinker includes a compound containing at least two functional groups selected from the group consisting of blocked isocyanate groups, alkenyl ether groups, and alkoxyhydrocarbyl groups. Preferably, the polyfunctional crosslinker of the present disclosure can include at least one compound selected from the group consisting of a compound containing at least two blocked isocyanate groups, a compound containing at least two alkenyl ether groups, and a compound containing at least two alkoxyhydrocarbyl groups. Each of the blocked isocyanate groups is an isocyanate group blocked by a blocking agent. Based on the total weight of the temporary bonding composition, a content of the polyfunctional crosslinker can be in a range of 0.5 wt % to 20 wt %. Preferably, the content of the polyfunctional crosslinker can be in a range of 0.8 wt % to 15 wt %. More preferably, the content of the polyfunctional crosslinker can be in a range of 2 wt % to 10 wt %.

According to the foregoing compound containing the at least two blocked isocyanate groups, which can include a structure represented by formula (I):

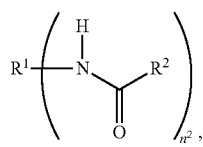

formula (I)

wherein $n^1$ is an integer greater than 2, $R^1$ is an organic group containing a substituted or an unsubstituted alkylene group, alicyclic ring, aromatic ring, dimer of isocyanate or trimer of isocyanate. The aforementioned "substituted" means that any atom on the organic group can be replaced by other hetero atoms. For example, the aforementioned substituted alkyl group can be any —$CH_2$— replaced by oxygen atom, —CH=CH—, or —C≡C—, such as an organic group containing an ether group. Any carbon atom of the aforementioned substituted aromatic ring can be but not limited to be replaced by an N atom. Each $R^2$ is independently a residue of the blocking agent.

The aforementioned blocking agent can be but not limited to alcohols, phenols, pyridines, oximes, mercaptans, thiophenols, amides, cyclic amides, imides, imidazolines, imidazoles, triazoles, amidines, hydroxamic acid esters, pyrazoles, amines, formates, active methylenes, ureas or diketones. Preferably, the blocking agent can be but not limited to butanol, ethanol, isopropanol, phenol, methylphenol, ethylphenol, cyclohexanol, butyl cellosolve, 2-butylphenol, 2-hydroxypyridine, butanone oxime, cyclohexanone oxime, acetone oxime, acetaldehyde oxime, 1-dodecanethiol, pentafluorothiophenol, thiophenol, acetanilide, methylacetanilide, caprolactam, butyrolactam, valerolactam, maleimide, succinimide, 2-phenylimidazole, imidazole, 2-methylimidazole, 2-phenylimidazole, triazole, benzotriazole, 3,5-dimethylpyrazole, 3-methylpyrazole, 2-methyl-4-ethyl-5-methylpyrazole, diisopropylamine, aniline, ethyl malonate, dimethyl malonate, ethyl acetoacetate, methyl acetoacetate, diethyl malonate, phenylurea or thiourea. Furthermore, depending on the process temperature of the semiconductor wafer package, the blocking agent is preferably selected to have the structure dissociated by heating at a temperature ranges from 90° C. to 200° C. For example, caprolactams, butanone oximes, ethyl malonates, etc.

Furthermore, after heating the aforementioned compound of formula (I), a crosslinkable structure having an isocyanate group can be formed, and can react with a resin. The structure can be but not limited to a functional group represented by any one of formula (i-1), formula (i-2), formula (i-3), formula (i-4), formula (i-5), formula (i-6), formula (i-7) and formula (i-8), wherein $R^3$ is a divalent organic group containing a substituted or an unsubstituted alkyl group, alkenyl group, alkynyl group, alicyclic ring or aromatic ring:

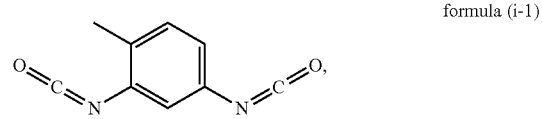

formula (i-1)

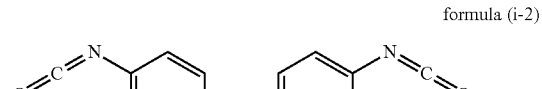

formula (i-2)

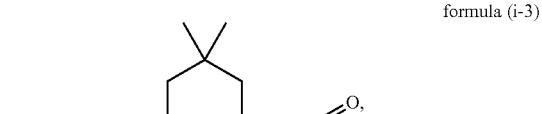

formula (i-3)

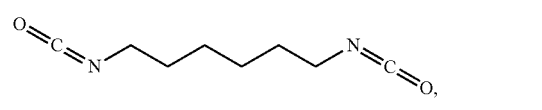

formula (i-4)

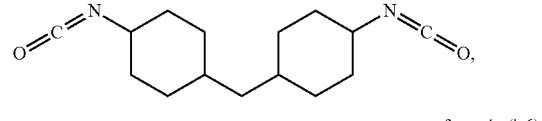

formula (i-5)

formula (i-6)

formula (i-7)

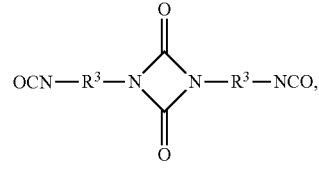

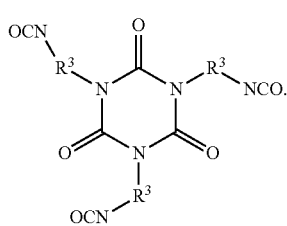

formula (i-8)

According to the foregoing compound containing the at least two alkenyl ether groups, which can include a structure represented by formula (II):

$$R^4-(O-CH=CH_2)_{n^2} \quad \text{formula (II),}$$

wherein $R^4$ is an organic group containing a substituted or an unsubstituted alkylene group, alicyclic ring or aromatic ring. The aforementioned "substituted" means that any atom on the organic group can be replaced by other hetero atoms. For example, the aforementioned substituted alkyl group can be any —$CH_2$— replaced by oxygen atom, —CH=CH—, or —C≡C—, such as an organic group containing an ether group. Any carbon atom of the aforementioned substituted aromatic ring can be but not limited to be replaced by an N atom, and $n^2$ is the integer greater than 2. Specifically, the compound of the formula (II) can be but not limited to a compound represented by any one of formula (II-1), formula (II-2), formula (II-3) and formula (II-4), wherein x is the integer greater than 1:

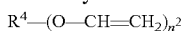

formula (II-1)

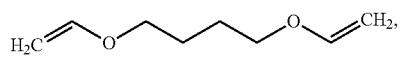

formula (II-2)

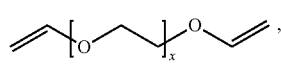

formula (II-3)

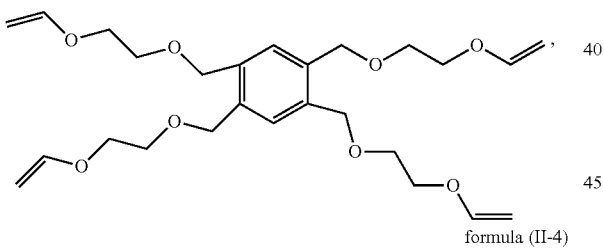

formula (II-4)

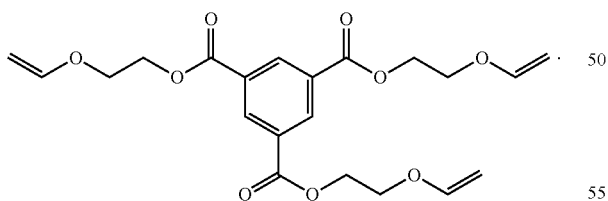

According to the foregoing compound containing the at least two alkoxyhydrocarbyl groups, which can include a structure represented by formula (III), formula (IV) or formula (V):

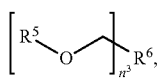

formula (III)

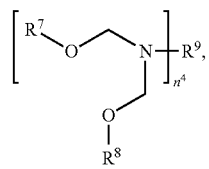

formula (IV)

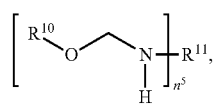

formula (V)

wherein $R^5$, $R^7$, $R^8$ and $R^{10}$ are each independently an organic group containing an alkyl group, an alicyclic ring or an aromatic ring, or hydrogen, preferably the organic group containing the alkyl group. $R^6$, $R^9$ and $R^{11}$ are organic groups containing an aromatic ring or a heterocyclic ring, $n^3$, $n^4$ and $n^5$ are each independently an integer greater than 2. Specifically, the compound of the formula (III) can be but not limited to a compound represented by any one of formula (III-1), formula (III-2), formula (III-3), formula (III-4) and formula (III-5):

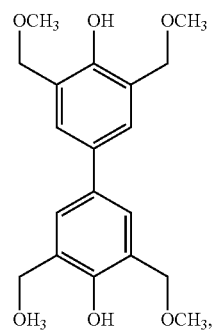

formula (III-1)

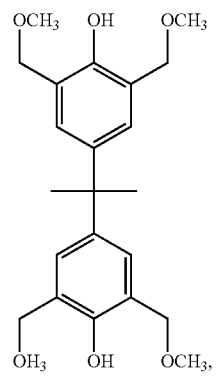

formula (III-2)

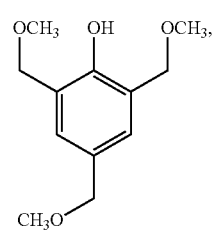

formula (III-3)

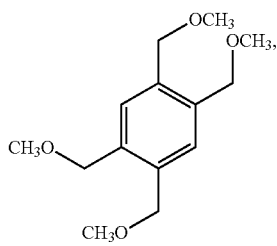

formula (III-4)

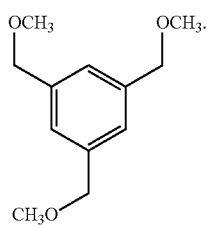

formula (III-5)

Specifically, the compound of the formula (IV) can be but not limited to a compound represented by any one of formula (IV-1), formula (IV-2) and formula (IV-3):

formula (IV-1)

formula (IV-2)

formula (IV-3)

Specifically, the compound of the formula (V) can be but not limited to a compound represented by formula (V-1):

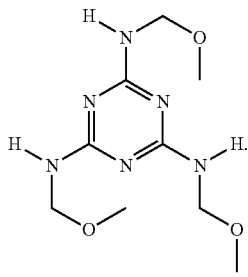

formula (V-1)

Polymer

In the present embodiments, the polymer has a functional group reacting with the polyfunctional crosslinker. Specifically, the polymer can be a polyamic acid, a polyimide, a polybenzoxazole, a copolymer or a mixture thereof including at least one of a hydroxyl group, a carboxyl group or an amine group. Based on the total weight of the temporary bonding composition, a content of the polymer can be in a range of 5 wt % to 60 wt %. Preferably, the content of the polymer can be in a range of 10 wt % to 55 wt %. More preferably, the content of the polymer can be in a range of 10 wt % to 52 wt %.

Solvent

In the present embodiments, the solvent can be an organic solvent. The organic solvent can be included but not limited to N-methylpyrrolidone, N, N-dimethylformamide, N, N-dimethylacetamide, N, N-diethylformamide, N-methylcaprolactam, dimethyl sulfoxide, γ-butyrolactone, γ-butyrolactam, ethylene glycol monomethyl ether, ethylene glycol monoethyl ether, ethylene glycol mono-n-propyl ether and ethylene glycol monobutyl ether, etc. The aforementioned solvent can be used for mixing two or more. In addition, the solvent that can dissolve the polymer or the solvent that mixing two or more can be used as the solvent of the present disclosure. Based on the total weight of the temporary bonding composition, a content of the solvent can be in a range of 5 wt % to 95 wt %. Preferably, the content of the solvent can be in a range of 20 wt % to 80 wt %.

Light Absorbing Material

In the present embodiments, the light absorbing material being added as appropriate depends on the wavelength range of the light source applied during the debonding process. The light absorbing material added in the material of the present disclosure can widen the wavelength range of the light source when debonding. The aforementioned light absorbing material can be an organic pigment, an inorganic pigment or a dye. Preferably, the inorganic pigment can be carbon black, titanium black, titanium oxide, iron oxide, titanium nitride or silica fume. Based on the total weight of the temporary bonding composition, a content of the light absorbing material can be in a range of 0 wt % to 30 wt %. Preferably, the content of the light absorbing material can be in a range of 0.5 wt % to 25 wt %.

A Temporary Bonding Film and a Composite Film

A temporary bonding film according to one embodiment of the present disclosure includes a polyfunctional crosslinker, a polymer and a light absorbing material. The polyfunctional crosslinker, the polymer and the light absorbing material can refer to the aforementioned paragraph, and will not be described herein. Furthermore, a glass transition temperature ($T_g$) of the temporary bonding film can be less than 200° C.

A composite film according to one embodiment of the present disclosure includes a detachable supported film and the temporary bonding film. The temporary bonding film is disposed on a surface of the detachable supported film. Specifically, the temporary bonding film is obtained by mixing the polyfunctional crosslinker, the polymer, the light absorbing and the solvent, then coated on the surface of the detachable supported film and heated to remove some or all of the solvent. The temporary bonding film of the composite film can be peeled.

The aforementioned detachable supported film can include but not limited to a synthetic resin film with the film thickness of 15 μm to 200 μm, such as polyethylene terephthalate (PET), polyethylene, polypropylene, polycarbonate or polyvinyl chloride. Furthermore, the aforementioned method of coating can include but not limited to the spin coating, the slit coating, the bar coating, the screen printing, etc.

A Temporary Bonding Method

Please refer to FIG. 1, which is a flow chart of a temporary bonding method 100 according to one embodiment of the present disclosure. The temporary bonding method 100 includes a step 110, a step 120, a step 130, a step 140 and a step 150.

In the step 110, a combining step is performed, wherein an adhesive layer is formed on a surface of at least one substrate and/or at least one workpiece. Specifically, the adhesive layer can be disposed on a surface of the substrate only, the adhesive layer can be disposed on a surface of the workpiece only, or the adhesive layer can be disposed on a surface of the substrate and a surface of the workpiece simultaneously. In addition, the number of the substrate to the number of the workpiece can be one-to-one, many-to-one or one-to-many. In other words, in the temporary bonding method 100 according to the present disclosure, one substrate can be used to support one workpiece, a plurality of substrates can be used to jointly support one workpiece, or one substrate can be used to support a plurality of workpieces simultaneously.

The aforementioned adhesive layer is formed by a temporary bonding composition. The temporary bonding composition can refer to the aforementioned paragraph, and will not be described herein. The aforementioned workpiece can be but not limited to a chip, a wafer or a micro device for semiconductor manufacturing. The micro device for semiconductor manufacturing can be but not limited to the micro device obtained by a metallurgical treatment, such as depositing a multilayer structure on the wafer, wiring, and then cutting. The specific examples of the micro device can include but not limited to a field-effect transistor, an optical sensor, a logic chip, a Known Good Die (KGD), and the size of the micro device ranges from 1 micrometer to several millimeters. The aforementioned substrate can be made of a glass, a silicon wafer, or other materials that can be penetrated by a laser.

In the step 120, a bonding step is performed, wherein the substrate and the workpiece are bonded by the adhesive layer. For convenience of explanation, the structure in which the substrate and the workpiece bonded by the adhesive layer is a joint structure hereafter. Specifically, the step 120 can be achieved by thermal compression bonding, that is, the workpiece, the adhesive layer and the substrate are bonded by applying the temperature and the pressure. The temperature can range from the room temperature to 250° C., and the pressure can range from 0.5 kgf/cm² to 5 kgf/cm².

In the step 130, a heating step is performed, wherein the substrate and the workpiece are heated. The temperature of the heating step can range from 90° C. to 200° C., so as to perform the crosslinking curing reaction. Furthermore, the temperature and time of the heating step can be appropriately adjusted depending on the actual demands, such as the selection of the type of functional groups of the polyfunctional crosslinker.

In the step 140, a processing step is performed, wherein the workpiece is processed. The processing method can be include but not limited to copper plating, etching, polishing, applique or printing.

In the step 150, a debonding step is performed, wherein the adhesive layer is irradiated with a laser so as to separate the workpiece from the substrate. The aforementioned laser can be a solid laser, such as a YAG laser, a ruby laser, a $YVO_4$ laser and an optical fiber laser, a liquid laser, such as a pigment laser, a gas laser, such as a $CO_2$ laser, an excimer laser, an Ar laser and a He—Ne laser, a semiconductor laser, a diode pump solid state laser (DPSSL), a free electron laser, etc.

Therefore, the temporary bonding method 100 of the present disclosure is favorable for fixing the workpiece on the substrate temporarily by the temporary bonding composition of the present disclosure. That is, during the processing, the workpiece can be fixed stably on the substrate. After the processing, the workpiece can be separated from the substrate easily, and the temporary bonding composition can be removed from the workpiece easily. Furthermore, the temporary bonding method 100 of the present disclosure is favorable for the high-temperature processes, thus the temporary bonding method 100 of the present disclosure can be used as the temporary bonding/debonding technology of the semiconductor. For example, the workpiece can be the wafer, and the substrate can be the support substrate. The required supporting force during the processing of the wafer is provided by the support substrate, the wafer can be prevented from being broken during the processing. Then, after the process, the wafer is separated from the substrate.

Figure 2:
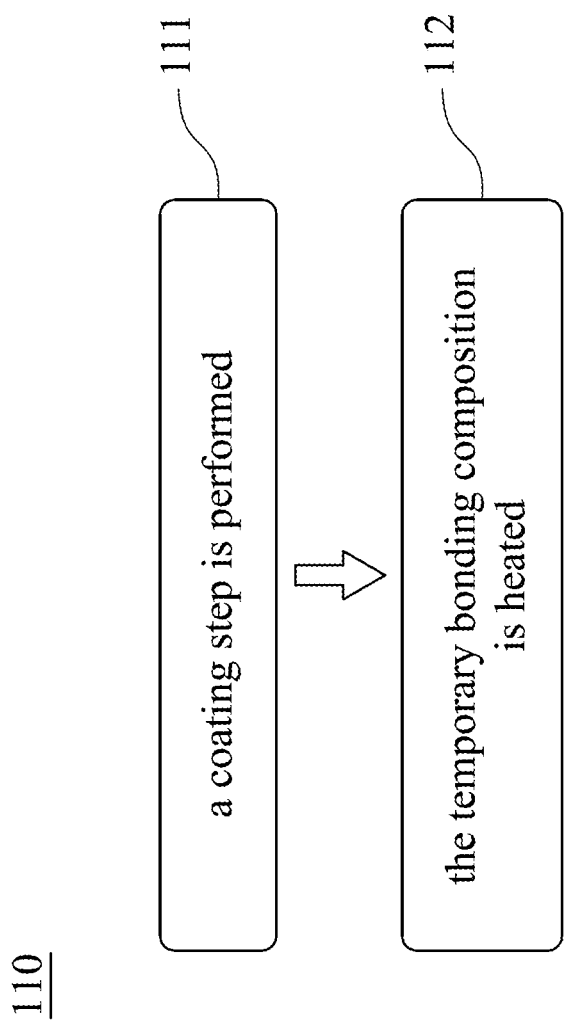
FIG. 2 is a flow chart of the step 110 in FIG. 1.

Please refer to FIG. 2, which is a flow chart of the step 110 in FIG. 1. In FIG. 2, the step 110 can include a step 111 and a step 112.

In the step 111, a coating step is performed, wherein the temporary bonding composition is coated on a surface of the substrate and/or the workpiece. The method of coating can be include but not limited to the spin coating, the slit coating, the bar coating, the screen printing, etc.

In the step 112, the temporary bonding composition is heated to make the temporary bonding composition be converted into the adhesive layer. The step 112 can be performed at the temperature of 50° C. to 200° C. for 0.5 hours to 2 hours, and the main purpose of the step 112 is removing some or all of the solvent of the temporary bonding composition. Furthermore, the temperature and the time of the step 112 can be adjusted appropriately according to the actual demands, such as the type of solvent or the amount of solvent.

Figure 3A:
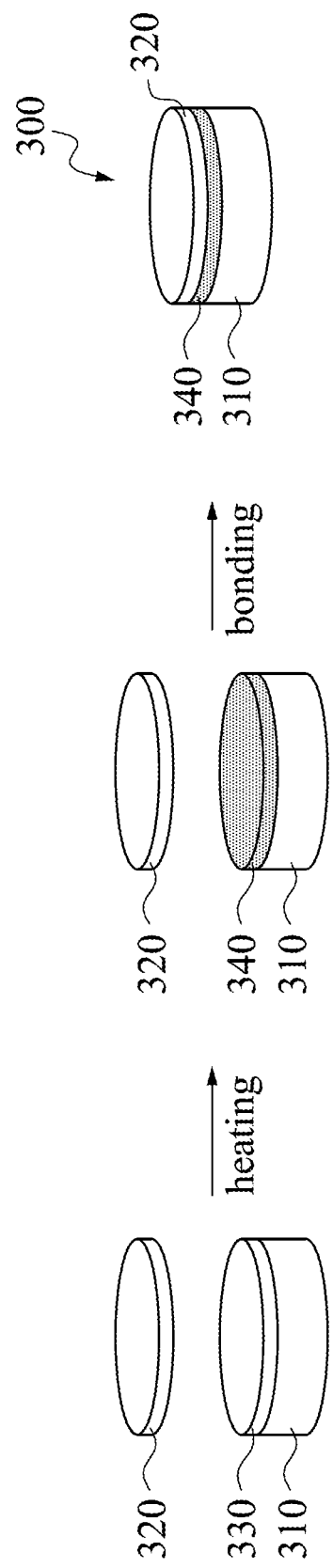
FIG. 3A is a schematic diagram of the step 110 and the step 120 in FIG. 1.
Figure 3B:
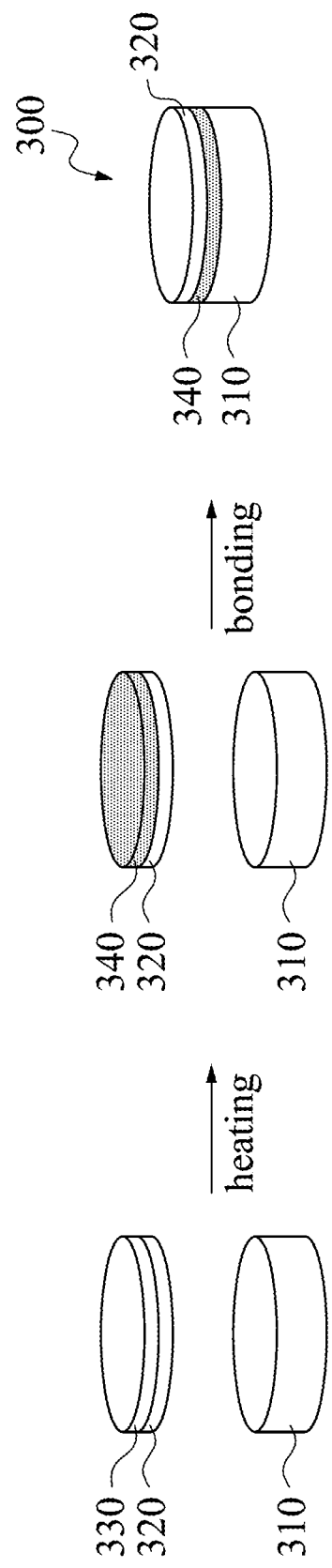
FIG. 3B is a schematic diagram of another step of the step 110 and the step 120 in FIG. 1.

Please refer to FIGS. 3A, 3B, and 3C. FIG. 3A is a schematic diagram of the step 110 and the step 120 in FIG. 1. FIG. 3B is a schematic diagram of another step of the step 110 and the step 120 in FIG. 1. FIG. 3C is a schematic diagram of further step of the step 110 and the step 120 in FIG. 1. As shown in FIG. 3A, the step 110 includes the step 111 and the step 112. When the step 111 is performed, the temporary bonding composition 330 can be coated on the surface (not labeled) of the substrate 310. Afterward, in the step 112, the temporary bonding composition 330 is heated, so that the temporary bonding composition 330 is converted into the adhesive layer 340. Then, in the step 120, the substrate 310 and the workpiece 320 are bonded by the adhesive layer 340 to form the joint structure 300. In FIG. 3B, the temporary bonding composition 330 is coated on the surface (not labeled) of the workpiece 320, and the workpiece 320 is turned over before performing the step 120, so that the adhesive layer 340 faces to the substrate 310 to form the joint structure 300. In FIG. 3C, the temporary bonding composition 330 is coated on the surface (not labeled) of the workpiece 320 and the surface (not labeled) of the substrate 310 simultaneously, and the workpiece 320 is turned over before performing the step 120, so that the adhesive layer 340 of the workpiece 320 faces to the adhesive layer 340 of the substrate 310 to form the joint structure 300. The remaining details of FIG. 3B and FIG. 3C can be the same as those of FIG. 3A, and it will not be described herein.

Figure 4:
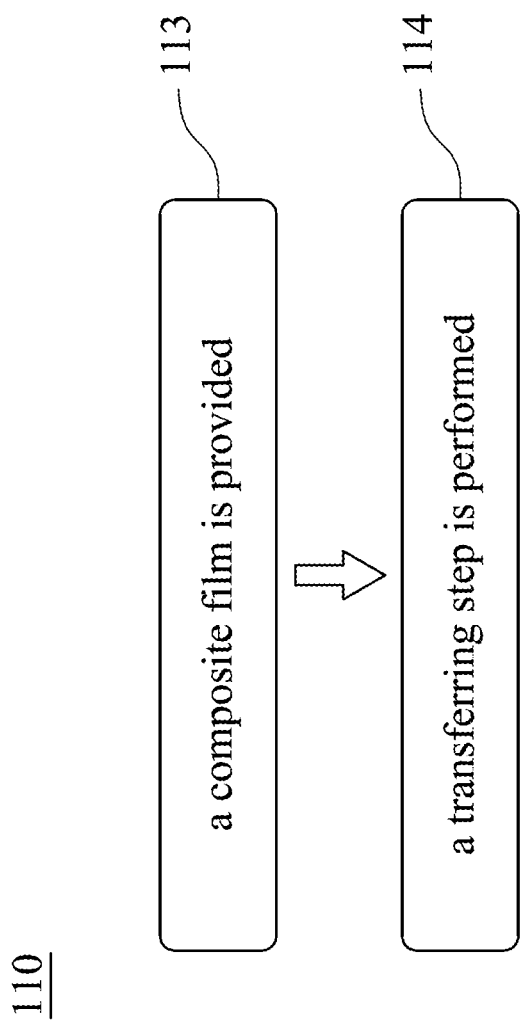
FIG. 4 is a flow chart of another step of the step 110 in FIG. 1.

Please refer to FIG. 4, which is a flow chart of another step of the step 110 in FIG. 1. In FIG. 4, the step 110 can include a step 113 and a step 114.

In the step 113, a composite film is provided. The composite film can refer to the aforementioned paragraph, and will not be described herein.

In the step 114, a transferring step is performed, wherein the surface of the substrate and/or the workpiece is in contact with the temporary bonding film of the composite film and heated so as to transfer the temporary bonding film to the surface of the substrate and/or the workpiece and the temporary bonding film is converted into the adhesive layer. Specifically, the step 114 can be heated at the temperature of 50° C. to 200° C. with rolling or vacuum thermal compression bonding, so that the temporary bonding film is transferred to the surface of the substrate and/or the workpiece. After the detachable supported film is removed, the step 114 is heated continuously at the temperature of 50° C. to 200° C. for 0.5 hours to 2 hours, so that the temporary bonding film is converted into the adhesive layer, and then performed the bonding step. The main purpose of heating in the step 114 is softening the temporary bonding film for transferring. Therefore, the subsequent transfer effect can be increased by adjusting the glass transition temperature.

Figure 5:
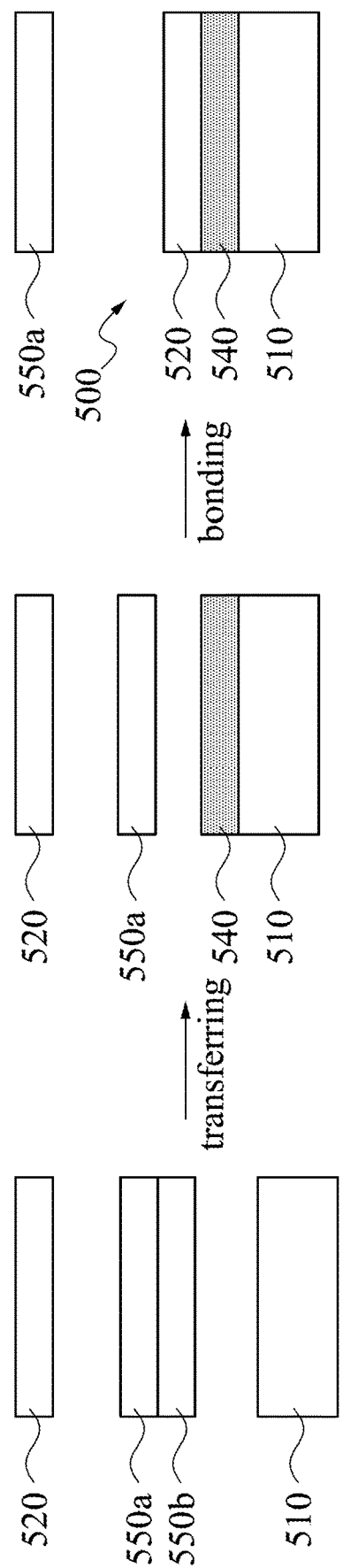
FIG. 5 is a schematic diagram of the step in FIG. 4.

Please refer to FIG. 5, which is a schematic diagram of the step in FIG. 4. As shown in FIG. 5, a composite film (not labeled) is provided in the step 113. The composite film includes the detachable supported film 550a and the temporary bonding film 550b. The temporary bonding film 550b is obtained by mixing the polyfunctional crosslinker, the polymer, the light absorbing material and the solvent, then coated on the surface (not labeled) of the detachable supported film 550a and heated to remove some or all of the solvent. Then, the step 114 is performed, wherein the surface (not labeled) of the substrate 510 is in contact with the temporary bonding film 550b of the composite film and heated, so as to transfer the temporary bonding film 550b to the surface of the substrate 510. After the detachable supported film 550a is removed, the step 114 is heated continuously to remove the residual solvent, and the temporary bonding film 550b is converted into the adhesive layer 540. Then the bonding step is performed to bond the substrate 510 and the workpiece 520 by the adhesive layer 540 to form the joint structure 500. In FIG. 5, the temporary bonding film 550b is transferred on the substrate 510. However, the present disclosure is not limited thereto. In the practice, the temporary bonding film 550b can be transferred on the workpiece 520, or the temporary bonding film 550b can be transferred on the substrate 510 and the workpiece 520 simultaneously, and then the bonding step is performed. Furthermore, in FIG. 5, the number, the shape, and the size of the substrate 510 and the workpiece 520 are merely example, and the present disclosure is not limited thereto.

Figure 6:
FIG. 6A is a side schematic view of a joint structure according to one embodiment of the present disclosure.
FIG. 6B is a side schematic view of a joint structure according to another embodiment of the present disclosure.

Please refer to FIGS. 6A and 6B. FIG. 6A is a side schematic view of a joint structure 600a according to one embodiment of the present disclosure. FIG. 6B is a side schematic view of a joint structure 600b according to another embodiment of the present disclosure. In FIG. 6A, the joint structure 600a includes a substrate 610a and two workpieces 620a. The substrate 610a and the workpieces 620a are bonded by the adhesive layer 640a. In the present embodiment, the numbers of the substrate 610a to the workpieces 620a is one-to-many. Furthermore, in FIG. 6B, the joint structure 600b includes two substrates 610b and a workpiece 620b. The substrates 610b and the workpiece 620b are bonded by the adhesive layer 640b. In the present embodiment, the numbers of the substrates 610b to the workpiece 620b is many-to-one.

As shown in FIGS. 3A, 3B, 3C, 5, 6A, and 6B, in the present disclosure, the numbers of the substrate to the workpiece can be one-to-one, one-to-many or many-to-one. Furthermore, in FIGS. 3A, 3B, 3C, 5, 6A, and 6B, the number, the shape, and the size of the substrate and the workpiece are merely example, and the present disclosure is not limited thereto.

Figure 7:
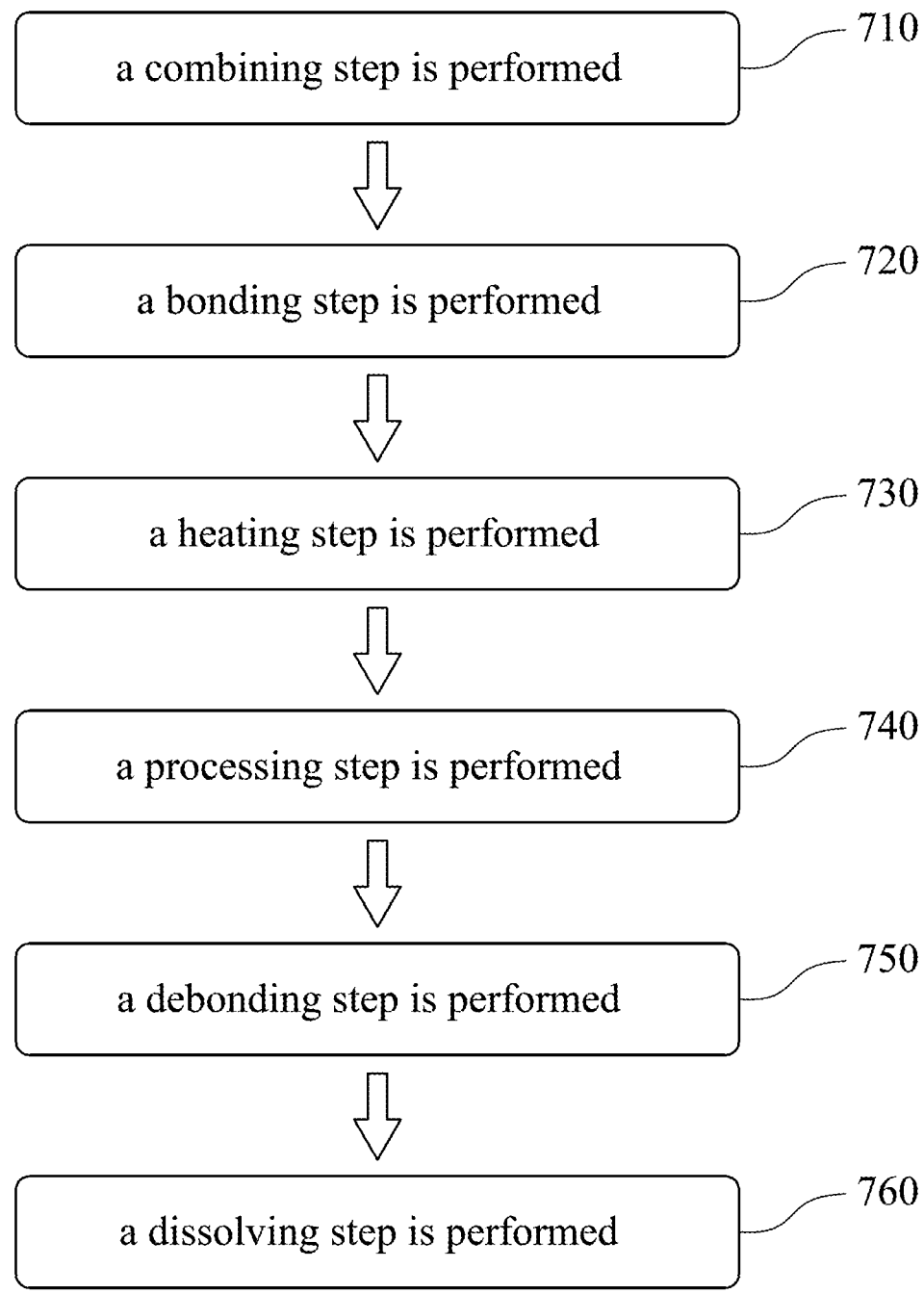
FIG. 7 is a flow chart of a temporary bonding method according to another embodiment of the present disclosure.

Please refer to FIG. 7, which is a flow chart of a temporary bonding method 700 according to another embodiment of the present disclosure. As shown in FIG. 7, the temporary bonding method 700 includes a step 710, a step 720, a step 730, a step 740, a step 750 and a step 760.

The step 710 is for performing a combining step, the step 720 is for performing a bonding step, the step 730 is for performing a heating step, the step 740 is for performing a processing step, and the step 750 is for performing a debonding step. The step 710 to the step 750 can refer to the related descriptions of the step 110 to the step 150 in FIG. 1, and it will not be described herein.

In the step 760, a dissolving step is performed, wherein the residue of the adhesive layer on the workpiece is dissolved and removed by a cleaning solvent after the debonding step. The aforementioned cleaning solvent can be but not limited to N, N-diethyl formamide (DEF), cyclohexanone, N-methyl pyrrolidinone (NMP) or gamma-butyl lactone (GBL). However, in order to select the solvent which is less harmful to the environment or the human body, the cleaning solvent of the present disclosure is preferably N, N-diethyl formamide as the main solvent.

A Method for Preparing the Polymer

The method for preparing the polymer according to one embodiment of the present disclosure can include performing the polycondensation reaction in the organic solvent by using a diamine and a dianhydride as a reactant, and stirred at the temperature of 25° C. to 50° C. for 8 hours to 12 hours to obtain a reaction solution containing polyamic acid, wherein the polycondensation reaction is adjusted according to the amount of the reaction. The aforementioned reaction solution containing polyamic acid is refluxed in the dehydration ring-closure reaction process by adding toluene at the temperature of 120° C. to 150° C. for 3 hours to 6 hours to obtain a reaction solution containing polyimide or an amic acid/imide copolymer. The amic acid/imide copolymer is a partially cyclized polyamic acid, wherein the cyclization ratio of the amic acid/imide copolymer can be greater than 70%, preferably, the cyclization ratio of the amic acid/imide copolymer can be greater than 90%. Finally, toluene is distilled by the aforementioned reaction solution of polyimide or the amic acid/imide copolymer, and the solid content is adjusted by the level of reduced pressure distillation or adding the organic solvent to obtain the amic acid/imide copolymer solution or the polyimide solution.

The aforementioned organic solvent, used to dissolve reactants and products, includes the organic solvent having the better solubility and the organic solvent having the poor solubility. The organic solvent having the better solubility includes but not limited to N-methylpyrrolidone, N, N-dimethylformamide, N, N-dimethylacetamide, N-methylcaprolactam, dimethyl sulfoxide, tetramethylurea, hexamethyl phosphoramide, γ-butyrolactone, and pyridine. The organic solvent having the poor solubility includes but not limited to methanol, ethanol, isopropanol, n-butanol, cyclohexanol, ethylene glycol, ethylene glycol monomethyl ether, ethylene glycol monoethyl ether, ethylene glycol monobutyl ether, ethylene glycol dimethyl ether, ethylene glycol diethyl ether, diethyl ether, acetone, methyl ethyl ketone, cyclohexanone, methyl acetate, ethyl acetate, tetrahydrofuran, dichloromethane, chloroform, 1,2-dichloroethane, benzene, toluene, xylene, n-hexane, n-heptane and n-octane. The aforementioned organic solvent can be used singly or by mixing two or more. Since the organic solvent is used to dissolve reactants and products, thus, any organic solvent that can dissolve reactants and products can be used, but is not limited to the above.

A Semiconductor Wafer Package

The semiconductor wafer package of the present disclosure includes the aforementioned temporary bonding composition. The temporary bonding composition can refer to the aforementioned paragraph, and will not be described herein. The structure and manufacturing method of the semiconductor wafer package are conventional and will not be further described herein.

The Evaluation Method

The property of thermal compression: a laminate of the temporary bonding composition is provided between two of the substrate and/or the workpiece and the laminate are thermal compressed at 2 kg/cm², and the proportion of the area of the temporary bonding composition to the whole area of the substrate is determined after thermal compression. The proportion of the area of the temporary bonding composition to the whole area of the substrate greater than 95% indicates an excellent result, between 95% and 75% indicates a great result, between 75% and 50% indicates a good result, and less than 50% indicates a poor result.

The property of solvent resistance after baking: the temporary bonding composition is formed into a film by baking, and then immersed in the solvent (AP7880T, purchased from Applichem Technology Corporation) at 70° C., and determined the degree of film damage. The degree of film damage less than 10% indicates an excellent result. The degree of film damage between 10% and 20% indicates a great result. The degree of film damage between 20% and 40% indicates a good result. The degree of film damage greater than 40% indicates a poor result.

The property of the laser releasing ability: the adhesive layer is irradiated with the laser until the debond occurred, the cumulative laser power greater than or equal to 2 W and less than 5 W indicates a great result, the cumulative laser power greater than or equal to 5 W and less than 8 W indicates a good result, and the cumulative laser power greater than 8 W indicates a poor result.

Synthesis Example

The diamine used in Synthesis Example is shown in Table 1. In Table 1, the trade name of diamine (A-1) is BisAPAF, the trade name of diamine (A-2) is JEFFAMINE-D400, and y is in accordance with the product specifications.

TABLE 1

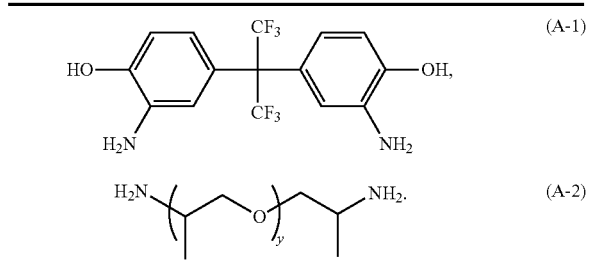

The dianhydride used in Synthesis Example is shown in Table 2. In Table 2, the trade name of the dianhydride (B-1) is BPADA.

TABLE 2

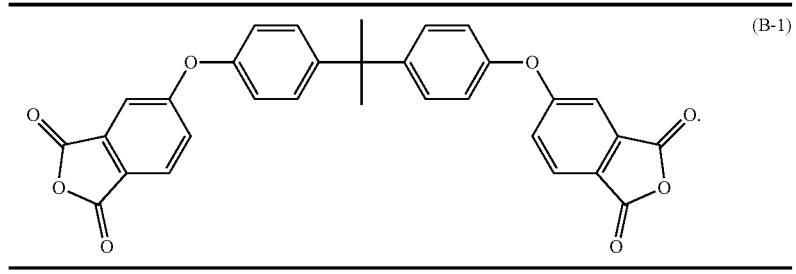

The diamine and the dianhydride are sequentially added to the solvent according to the ratio shown in Table 3, so as to prepare the amic acid/imide copolymer solution or the polyimide solution. The solid content of the amic acid/imide copolymer solution or the polyimide solution is 20 wt %.

Specifically, the diamine and the dianhydride are performed the polycondensation reaction in the organic solvent according to the ratio shown in Table 3, and stirred at the temperature of 25° C. to 50° C. for 8 hours to 12 hours to obtain a reaction solution containing polyamic acid, wherein the polycondensation reaction is adjusted according to the amount of the reactants. The aforementioned reaction solution containing polyamic acid is refluxed in the dehydration ring-closure reaction process by adding toluene at the temperature of 120° C. to 150° C. for 3 hours to 6 hours to obtain a reaction solution containing polyimide or the amic acid/imide copolymer. The cyclization ratio of the amic acid/imide copolymer is greater than 90%. Finally, toluene is distilled from the aforementioned reaction solution of polyimide or the amic acid/imide copolymer, and the solid content is adjusted by the level of reduced pressure distillation or adding the organic solvent to obtain the polyimide solution or the amic acid/imide copolymer solution. The solid content of the polyimide solution or the amic acid/imide copolymer solution is 20 wt %.

TABLE 3

| component | | Synthesis Example 1 | Synthesis Example 2 | Synthesis Example 3 | Synthesis Example 4 |
|---|---|---|---|---|---|
| diamine (wt %) | (A-1) | 20 | 5 | 40 | 0 |
| | (A-2) | 23 | 39 | 1 | 45 |
| dianhydride (wt %) | (B-1) | 57 | 56 | 59 | 55 |

Example/Comparative Example

The polyfunctional crosslinker used in Example/Comparative Example is shown in Table 4. In Table 4, the polyfunctional crosslinker (a-1), the polyfunctional crosslinker (a-2) and the polyfunctional crosslinker (a-3) are compounds containing at least two blocked isocyanate groups formed by isocyanate groups combined with different blocking agents. The polyfunctional crosslinker (b-1) and the polyfunctional crosslinker (b-2) are compounds containing at least two alkenyl ether groups. The polyfunctional crosslinker (c-1) and the polyfunctional crosslinker (c-2) are compounds containing at least two alkoxyhydrocarbyl groups. Furthermore, the polyfunctional crosslinker (d-1) is a thermal crosslinker of an epoxy compound, and the polyfunctional crosslinker (d-2) is a non-blocking isocyanate.

TABLE 4

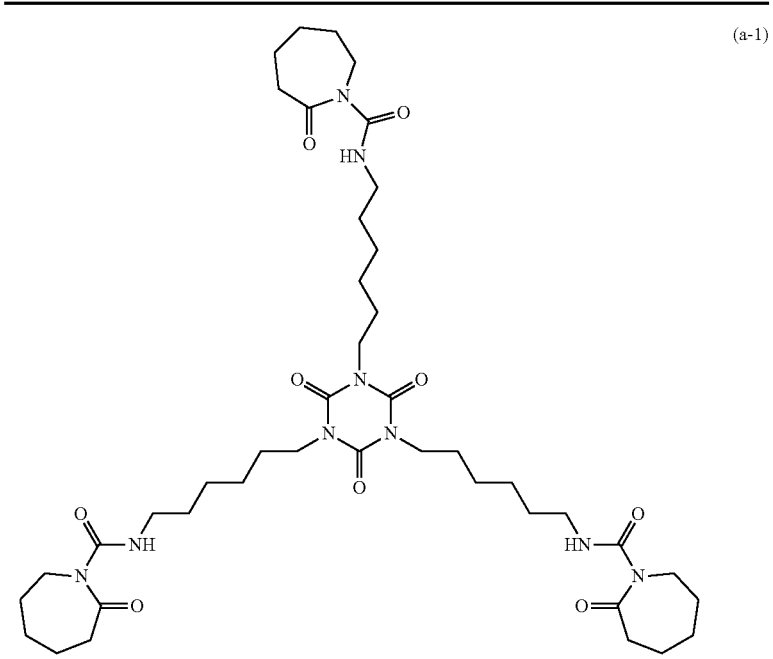

(a-1)

TABLE 4-continued
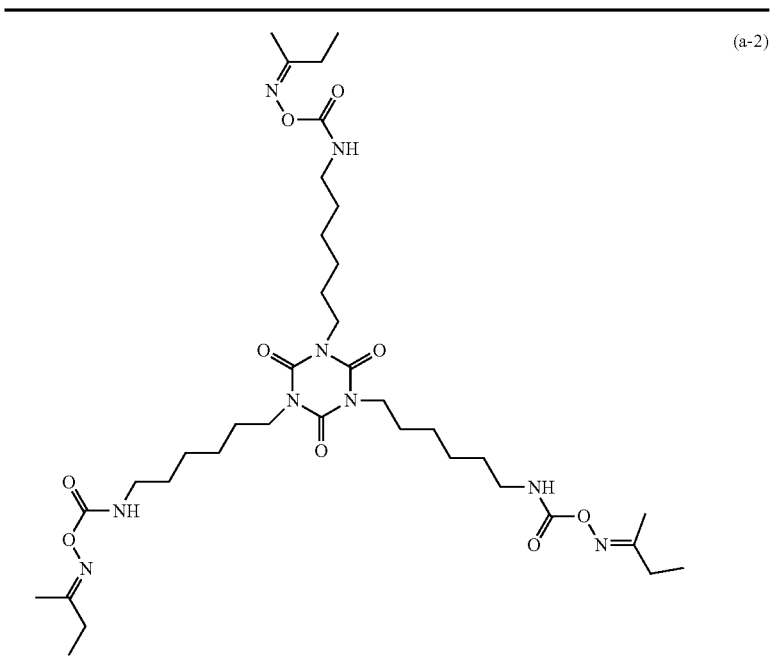
(a-2)
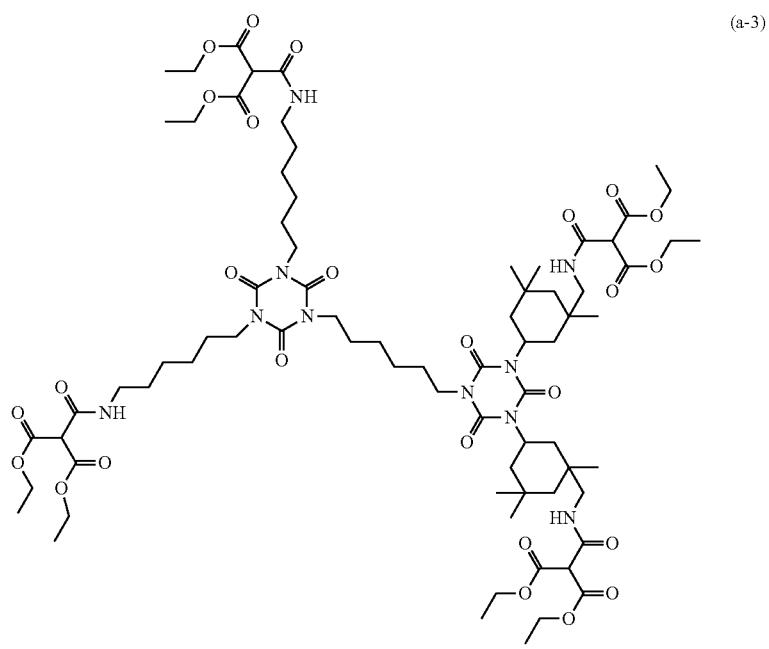
(a-3)
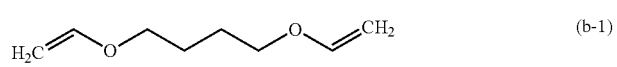
(b-1)
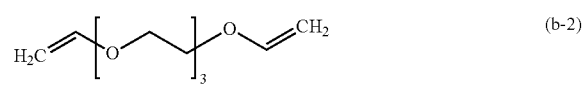
(b-2)

TABLE 4-continued

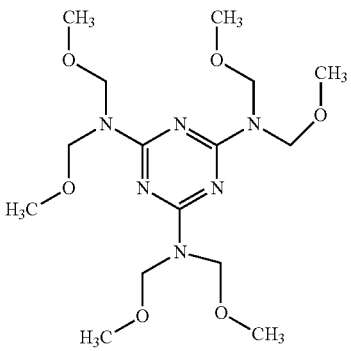

(c-1)

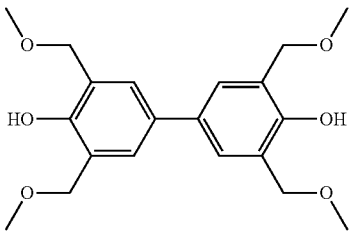

(c-2)

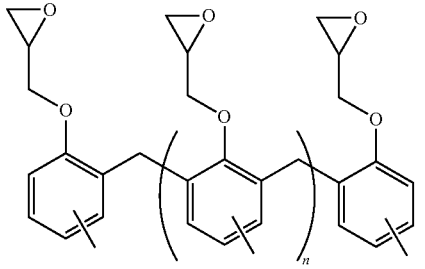

(d-1)

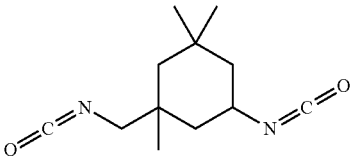 [SMILES: CC1(C)CC(N=C=O)CC(C)(CN=C=O)C1]

(d-2)

The light absorbing material used in Example/Comparative Example is carbon black, which is bought from Daxin Materials Co., Ltd. The trade name of carbon black is PK-127, and the average particle diameter of carbon black is 120 nm.

The type and the content of the polymer, the polyfunctional crosslinker, the solvent and the light absorbing material are according to Table 5 to prepare the temporary bonding composition of Example/Comparative Example.

TABLE 5

| component | Example 1 | Example 2 | Example 3 | Example 4 |
|---|---|---|---|---|
| polymer | Synthesis Example 1 | Synthesis Example 1 | Synthesis Example 1 | Synthesis Example 1 |
| polymer content (wt %) | 27.2 | 20 | 38.4 | 26 |
| polyfunctional crosslinker | (a-1) | (a-1) | (a-2) | (c-2) |
| polyfunctional crosslinker content (wt %) | 0.8 | 8 | 0.8 | 2 |
| light absorbing material content (wt %) | 12 | 12 | 0.8 | 12 |
| solvent | DEF | DEF | DEF | DEF |
| solvent content (wt %) | 60 | 60 | 60 | 60 |
| component | Example 5 | Example 6 | Example 7 | Example 8 |
| polymer | Synthesis Example 2 | Synthesis Example 3 | Synthesis Example 2 | Synthesis Example 2 |
| polymer content (wt %) | 24 | 12 | 39 | 52 |
| polyfunctional crosslinker | (a-1) | (a-1) | (b-1) | (c-1) |
| polyfunctional crosslinker content (wt %) | 4 | 2 | 3 | 4 |

TABLE 5-continued

| light absorbing material content (wt %) | 12 | 6 | 18 | 24 |
|---|---|---|---|---|
| solvent | DEF | DEF | DEF | DEF |
| solvent content (wt %) | 60 | 80 | 40 | 20 |

| component | Example 9 | Example 10 |
|---|---|---|
| polymer | Synthesis Example 1 | Synthesis Example 1 |
| polymer content (wt %) | 26 | 36 |
| polyfunctional crosslinker | (b-1) | (a-1) |
| polyfunctional crosslinker content (wt %) | 2 | 4 |
| light absorbing material content (wt %) | 12 | 0 |
| solvent | DEF | DEF |
| solvent content (wt %) | 60 | 60 |

| component | Comparative Example 1 | Comparative Example 2 |
|---|---|---|
| polymer | Synthesis Example 4 | Synthesis Example 1 |
| polymer content (wt %) | 12 | 28 |
| polyfunctional crosslinker | (a-3) | — |
| polyfunctional crosslinker content (wt %) | 2 | 0 |
| light absorbing material content (wt %) | 6 | 12 |
| solvent | DEF | DEF |
| solvent content (wt %) | 80 | 60 |

| component | Comparative Example 3 | Comparative Example 4 |
|---|---|---|
| polymer | Synthesis Example 1 | Synthesis Example 1 |
| polymer content (wt %) | 24 | 24 |
| polyfunctional crosslinker | (d-1) | (d-2) |
| polyfunctional crosslinker content (wt %) | 4 | 4 |
| light absorbing material content (wt %) | 12 | 12 |
| solvent | DEF | DEF |
| solvent content (wt %) | 60 | 60 |

The evaluation of the joint structure of Example/Comparative Example is performed, such as the properties of the thermal compression, the solvent resistance after baking, the laser releasing ability, etc. The laser wavelengths used in Example/Comparative Example and the evaluation results are shown in

TABLE 6

| Evaluation | Example 1 | Example 2 | Example 3 | Example 4 |
|---|---|---|---|---|
| thermal compression | ◎ | ○ | ◎ | ○ |
| solvent resistance after baking | ○ | ◎ | ○ | ◎ |
| laser releasing ability | ◎ | ◎ | ○ | ◎ |
| laser wavelengths (nm) | 355/532/1064 | 355/532/1064 | 355/532/1064 | 355/532/1064 |

| Evaluation | Example 5 | Example 6 | Example 7 | Example 8 |
|---|---|---|---|---|
| thermal compression | ◎ | ○ | ○ | ○ |
| solvent resistance after baking | ○ | ◎ | ◎ | ◎ |
| laser releasing ability | ◎ | ◎ | ◎ | ◎ |
| laser wavelengths (nm) | 355/532/1064 | 355/532/1064 | 355/532/1064 | 355/532/1064 |

| Evaluation | Example 9 | Example 10 |
|---|---|---|
| thermal compression | Δ | ◎ |
| solvent resistance after baking | ◎ | ◎ |
| laser releasing ability | ◎ | ○ |
| laser wavelengths (nm) | 355/532/1064 | 532 |

| Evaluation | Comparative Example 1 | Comparative Example 2 |
|---|---|---|
| thermal compression | ◎ | ◎ |
| solvent resistance after baking | X | X |
| laser releasing ability | ◎ | ◎ |
| laser wavelengths (nm) | 355/532/1064 | 355/532/1064 |

TABLE 6-continued

| Evaluation | Comparative Example 3 | Comparative Example 4 |
|---|---|---|
| thermal compression | ○ | X |
| solvent resistance after baking | X | ◎ |
| laser releasing ability | ◎ | ◎ |
| laser wavelengths (nm) | 355/532/1064 | 355/532/1064 |

Note:
" ◎ " means excellent, " ○ " means great, " Δ " means good, " X " means poor, "—" means not tested.

Note:
The laser wavelength (nm) used is "355/532/1064", which means that 355 nm, 532 nm and 1064 nm are applicable wavelengths. It can be debonded by the laser with the wavelength of 355 nm independently, or can be debonded by the laser with the wavelength of 532 nm independently, or can be debonded by the laser with the wavelength of 1064 nm independently.

As shown in Table 5 and Table 6, the polymer of Comparative Example 1 does not contain an OH functional group, which causes the poor solvent resistance after baking of Comparative Example 1. Furthermore, the polyfunctional crosslinkers of Comparative Example 2 to Comparative Example 4 are different from Example 1 to Example 10. Comparative Example 2 does not add the polyfunctional crosslinker of the present disclosure. The polyfunctional crosslinker of Comparative Example 3 has an epoxy group structure. The polyfunctional crosslinker of Comparative Example 4 is a non-blocking isocyanate. It can be indicated that without adding the polyfunctional crosslinker of the present disclosure and by the use of polyfunctional crosslinker not of the present disclosure, excellent thermal compression and solvent resistance cannot be obtained simultaneously. Therefore, in the temporary bonding composition of Example 1 to Example 10 of the present disclosure, the thermal compression are excellent, great or good, the solvent resistance after baking are excellent or great, and the laser releasing ability are excellent or great. It is shown that the temporary bonding composition of the present disclosure has the excellent thermal compression and solvent resistance, which is favorable for the application of the temporary bonding/debonding technique.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A temporary bonding method, comprising:
   performing a combining step, wherein an adhesive layer is formed on a surface of at least one substrate and/or at least one workpiece;
   performing a bonding step, wherein the at least one substrate and the at least one workpiece are bonded by the adhesive layer;
   performing a heating step, wherein the at least one substrate and the at least one workpiece are heated;
   performing a processing step, wherein the at least one workpiece is processed; and
   performing a debonding step, wherein the adhesive layer is irradiated with a laser so as to separate the at least one workpiece from the at least one substrate;
   wherein the adhesive layer is formed by a temporary bonding composition, and the temporary bonding composition comprises:
      a polyfunctional crosslinker, wherein the polyfunctional crosslinker comprises a compound containing at least two functional groups selected from the group consisting of blocked isocyanate groups, alkenyl ether groups, and alkoxyhydrocarbyl groups, and each of the blocked isocyanate groups is an isocyanate group blocked by a blocking agent;
      a polymer, wherein the polymer has a functional group reacting with the polyfunctional crosslinker; and
      a solvent.

2. The temporary bonding method of claim 1, wherein a temperature of the heating step ranges from 90° C. to 200° C.

3. The temporary bonding method of claim 1, wherein the combining step comprises:
   performing a coating step, wherein the temporary bonding composition is coated on the surface of the at least one substrate and/or the at least one workpiece; and
   heating the temporary bonding composition to make the temporary bonding composition be converted into the adhesive layer.

4. The temporary bonding method of claim 1, wherein the combining step comprises:
   providing a composite film, the composite film comprising:
      a detachable supported film; and
      a temporary bonding film, wherein the temporary bonding film is obtained by the temporary bonding composition coated on a surface of the detachable supported film and heated to remove the solvent; and
   performing a transferring step, wherein the surface of the at least one substrate and/or the at least one workpiece is contacted with the temporary bonding film of the composite film and heated, so as to transfer the temporary bonding film to the surface of the at least one substrate and/or the at least one workpiece and the temporary bonding film is converted into the adhesive layer.

5. The temporary bonding method of claim 1, further comprising:
   performing a dissolving step, wherein a residue of the adhesive layer on the at least one workpiece is dissolved and removed by a cleaning solvent after the debonding step.

6. The temporary bonding method of claim 1, wherein the at least one workpiece is a chip, a wafer or a micro device for semiconductor manufacturing.

* * * * *